US011087976B2

(12) United States Patent
Schjødt et al.

(10) Patent No.: US 11,087,976 B2
(45) Date of Patent: Aug. 10, 2021

(54) KESTERITE MATERIAL OF CZTS, CZTSE OR CZTSSE TYPE

(71) Applicant: HALDOR TOPSØE A/S, Kgs. Lyngby (DK)

(72) Inventors: Niels Christian Schjødt, Hvalsø (DK); Søren Dahl, Hillerød (DK); Jesper Nerlov, Værløse (DK)

(73) Assignee: HALDOR TOPSØE A/S, Kgs. Lyngby (DK)

( * ) Notice: Subject to any disclaimer, the term of this patent is extended or adjusted under 35 U.S.C. 154(b) by 0 days.

(21) Appl. No.: 16/324,114

(22) PCT Filed: Sep. 1, 2017

(86) PCT No.: PCT/EP2017/071994
§ 371 (c)(1),
(2) Date: Feb. 7, 2019

(87) PCT Pub. No.: WO2018/065156
PCT Pub. Date: Apr. 12, 2018

(65) Prior Publication Data
US 2019/0172711 A1 Jun. 6, 2019

(30) Foreign Application Priority Data
Oct. 7, 2016 (DK) .................... PA 2016 00601

(51) Int. Cl.
*H01L 31/032* (2006.01)
*C01B 19/00* (2006.01)
*H01L 21/02* (2006.01)
*C01G 19/00* (2006.01)

(52) U.S. Cl.
CPC ...... *H01L 21/02535* (2013.01); *C01B 19/002* (2013.01); *C01G 19/006* (2013.01); *H01L 31/0326* (2013.01); *C01P 2002/77* (2013.01); *C01P 2004/62* (2013.01); *C01P 2004/64* (2013.01); *C01P 2006/40* (2013.01)

(58) Field of Classification Search
CPC ........... H01L 21/02535; H01L 31/0326; C01B 19/002; C01P 2002/77; C01P 2004/62; C01P 2004/64; C01P 2006/40
See application file for complete search history.

(56) References Cited

U.S. PATENT DOCUMENTS

| 5,209,911 | A  | * | 5/1993  | Randall ................. | C01G 19/00 |
| | | | | | 423/101 |
| 6,176,996 | B1 | * | 1/2001  | Moon ...................... | C25D 3/60 |
| | | | | | 205/254 |
| 9,105,796 | B2 | * | 8/2015  | Cao ......................... | H01L 31/18 |
| 9,112,094 | B2 | * | 8/2015  | Johnson .............. | C23C 18/1204 |
| 9,178,097 | B2 | * | 11/2015 | Liang ................ | H01L 21/02472 |
| 9,525,095 | B2 | * | 12/2016 | Chane-Ching ......... | B82Y 30/00 |
| 2008/0138272 | A1 | * | 6/2008  | Ohmori .................. | B82Y 30/00 |
| | | | | | 423/622 |
| 2009/0205714 | A1 | * | 8/2009  | Kuhnlein ................ | H01L 31/06 |
| | | | | | 136/264 |
| 2010/0230643 | A1 | * | 9/2010  | Nakajima ............... | C23C 18/08 |
| | | | | | 252/512 |
| 2011/0097496 | A1 | * | 4/2011  | Mitzi ................ | H01L 21/02568 |
| | | | | | 427/256 |
| 2012/0061250 | A1 | * | 3/2012  | Ahmed .................... | C25D 3/22 |
| | | | | | 205/310 |
| 2012/0288987 | A1 | * | 11/2012 | Radu ..................... | C01G 19/006 |
| | | | | | 438/95 |
| 2013/0037100 | A1 | * | 2/2013  | Platzer Bjorkman ...................... |
| | | | | | H01L 31/022466 |
| | | | | | 136/256 |
| 2013/0125988 | A1 | | 5/2013  | Cao et al. | |
| 2014/0110640 | A1 | | 4/2014  | Kamiya et al. | |
| 2016/0218231 | A1 | | 7/2016  | Park et al. | |

FOREIGN PATENT DOCUMENTS

WO 2012174551 A2 12/2012

OTHER PUBLICATIONS

Maiti et al. [Materials Science and Engineering, A333 (2002, 35-40], (Year: 2002).*
Huang et al. [CrystEngComm, 2012, 14, 3283] (Year: 2012).*
Li et al. {Journal of Alloys and Compounds 610 (2014) 331-336] (Year: 2014).*
Liu et al. [Solar Energy Materials & Solar Cells 157 (2016) 221-228] (Year: 2016).*
Cao et al. [Materials Letters 139 (2015) 101-103] (Year: 2015).*
Huang, J. et al."Large-scale selective preparation of porous SnO2 3D architectures and their gas-sensing property" CrystEngComm, vol. 14, 2012, pp. 3283-3290.
Hemmati, S. et al." Nanostructured SnO2—ZnO sensors: Highly sensitive and selective to ethanol" Elsevier, Sensors and Actuators B; Chemical, vol. 160, pp. 2011, 1298-1303.
Deng, Y. et al."Selenization of mixed metal oxides for dense and ZnSe-free Cu2ZnSnSe4 absorber films" Elsevier, Journal of Alloys and Compounds, vol. 591, 2014, pp. 117-120.
Valls, R. M. et al."Easy and low-cost aqueous precipitation method to obtain CU2ZnSn(S, Se)4 thin layers" Solar Energy Materials & Solar Cells, vol. 1611, 2017, 18 pages.
International Search Report and Written Opinion issued in corresponding International Patent Application No. PCT/EP2017/071994, 10 pages (dated Nov. 7, 2017).

(Continued)

*Primary Examiner* — Sheng H Davis
(74) *Attorney, Agent, or Firm* — Buchanan Ingersoll & Rooney P.C.

(57) ABSTRACT

A method of producing a kesterite material of CZTS, CZTSe or CZTSSe type, including the steps of: a) preparing an acidic solution by dissolving copper and zinc salts in water in desired molar ratio, b) preparing a basic solution by dissolving an alkali metal stannate together with an alkali metal carbonate or an alkali metal hydrogen carbonate or an alkali metal hydroxide or a combination thereof, and optionally with an alkali metal selenate or an alkali metal selenite or a mixture thereof, c) carrying out a precipitation reaction by mixing the acidic and the basic solution, d) drying the precipitate thereby providing a precursor for the kesterite material, and e) sulfurizing the precursor of step d to provide the kesterite material. Also, a precursor for a kesterite material of CZTS, CZTSe or CZTSSe type.

15 Claims, No Drawings

(56) References Cited

OTHER PUBLICATIONS

Search Report issued in corresponding Danish Patent Application No. PA201600601, 7 pages (dated Mar. 23, 2017).
Office Action (Notification of the First Office Action) dated Mar. 25, 2021, by the China National Intellectual Property Administration in corresponding Chinese Patent Application No. 2017800394433, and an English Translation of the Office Action. (11 pages).
Tang, et al. "An alternative route towards low-cost Cu2ZnSnS4 thin film solar cells" Surface & Coatings Technology, vol. 232, 2013, pp. 53-59.
Xu, R. et al. "CuSn(OH)6 submicrospheres: Room-temperature synthesis and weak antiferromagnetic behavior" Materials Letters vol. 65, 2011, pp. 733-735.

\* cited by examiner

KESTERITE MATERIAL OF CZTS, CZTSE OR CZTSSE TYPE

FIELD OF THE INVENTION

Embodiments of the invention generally relate to a method of producing a kesterite material of CZTS, CZTSe or CZTSSe. The invention moreover relates to a precursor material for a kesterite material of CZTS, CZTSe or CZTSSe type.

BACKGROUND

Kesterite materials of CZTS (copper zinc tin sulfide) type, of CZTSSe (copper zinc tin selenide sulfide) or CZTSe (copper zinc tin selenide) type are semiconducting compounds which have received increasing interest since the late 2000s for applications in solar cells. Kesterite materials of CZTS, CZTSe or CZTSSe types offer favorable optical and electronic properties similar to CIGS (copper indium gallium selenide) making them well suited for use as a thin-film solar cell absorber layer. However, unlike CIGS materials and other thin films such as CdTe, CZTS, CZTSe or CZTSSe are composed of only abundant and non-toxic elements. Concerns with the price and availability of indium in CIGS and tellurium in CdTe, as well as toxicity of cadmium have been a large motivator to search for alternative thin film solar cell materials.

CZTS, CZTSe or CZTSSe type materials may be prepared by a variety of vacuum and non-vacuum techniques. Some methods involve hazardous chemicals such as hydrazine. An object of the present invention is to provide a facile, cost-conscious and easily scalable method for production of kesterite materials of CZTS, CZTSe or CZTSSe types. It is also an object of the present invention to provide a non-hazardous production method.

Moreover, it is an object of the invention to provide a precursor for a kesterite material of the CZTS, CZTSe or CZTSSe type for subsequent sulfidation, where the resultant kesterite material has good efficiency values and/or a high purity.

SUMMARY OF THE INVENTION

Embodiments of the invention generally relate to a method of producing a kesterite material of CZTS, CZTSe or CZTSSe type. The invention moreover relates to a precursor material for a kesterite material of CZTS, CZTSe or CZTSSe type.

One embodiment of the invention provides a method producing a kesterite material of CZTS, CZTSe or CZTSSe type. The method comprises the steps of:

a) preparing an acidic solution by dissolving copper and zinc salts in water in desired molar ratio, b) preparing a basic solution by dissolving an alkali metal stannate together with an alkali metal carbonate or an alkali metal hydrogen carbonate or an alkali metal hydroxide or a combination thereof, and optionally with an alkali metal selenate or an alkali metal selenite or a mixture thereof, c) carrying out a precipitation reaction by mixing the acidic and the basic solution, thereby obtaining a precipitate, d) washing and heat treating the precipitate thereby providing a precursor for the kesterite material, and e) sulfurizing the precursor of step d) to provide the kesterite material.

In steps a) to d) an essentially sulfur-free precursor material for a kesterite material is obtained by co-precipitation, washing and heat treating. In the subsequent step e), the precursor material obtained by steps a) to d) is sulfided. This method where the sulfidation takes place at a separate step provides for a resultant material of higher purity than what is obtained if the sulfur was introduced from the beginning, e.g. as a metal sulfide, to provide a basic or alkaline solution for the precipitation reaction.

The acidic solution of step a) and the basic solution of step b) are typically made in distilled or deionized water, and the pH values thereof are controlled, e.g. by dilution with distilled, demineralized or de-ionized water. During step c) a precipitate forms essentially containing the metal components, and optionally selenium, of the solutions in the predetermined stoichiometry. The heat treatment in step d) is e.g. carried out by supplying heat to remove excess washing liquid, e.g. water, and potentially to convert the precursor to a form that is more suited for sulfidation, e.g. by decomposing carbonates to oxides. Moreover, if necessary, further steps may be carried out between step d) and step e), such as e.g. filtering.

The identity of the kesterite materials prepared according to the invention may be proven by using X-ray diffraction (XRD) and/or Raman spectroscopy (Raman).

The stoichiometry of the CZTS, CZTSe or CZTSSe phase of the invention is $Cu_{2-x}Zn_{1+y}Sn(S_{1-z}Se_z)_{4+q}$ where $0 \le x \le 1$; $0 \le y \le 1$; $0 \le z \le 1$; $-1 \le q \le 1$. Preferable values for x lie in the range: $0 \le x \le 0.4$. Preferable values for y lie in the range: $0.1 \le y \le 0.3$. Preferably, the ratio between $(2-x)$ and $(2+y)$ is in the range: $0.75 \le (2-x)/(2+y) \le 0.9$.

Advantages of the method are i.a.:
- The production method is aqueous based and does not involve any hazardous components;
- The production method does not imply the use of vacuum;
- The co-precipitation may be conducted at temperatures below 100° C.;
- The production method is easy to scale up; and
- The kesterite material obtained is an almost phase pure kesterite material, comprising a very low fraction of copper sulfides, according to Raman spectroscopy.

In an embodiment the salts used for the acidic solution are nitrates, halides, sulfates, carboxylates or combinations thereof. These salts have a substantial solubility in water which is a prerequisite for the precipitation process of the present invention.

In an embodiment the copper salt is copper (II) nitrate and the zinc salt is zinc (II) nitrate. The nitrate salts have a very high solubility in water and furthermore, any residual nitrate in the kesterite precursor will be transformed into gaseous products during the final sulfidation step. This is preferable to the use of e.g. halide salts since residual halide ions are more difficult to remove and will pollute the kesterite phase. The acidic solution may optionally comprise excess acid, such as nitric acid.

In an embodiment the alkali metal stannate comprises $Na_2SnO_3$ and/or $K_2SnO_3$ in hydrated or anhydrous form. In an embodiment, the basic solution further comprises selenium in the form of an alkali metal selenate and/or an alkali metal selenite. This provides an easy and accurate method of adding the selenium part to the kesterite precursor.

In an embodiment, the step of sulfurizing comprises subjecting the dried or calcined precursor to a sulfur comprising gas at a temperature above room temperature. The sulfidation temperature may e.g. be about 400° C. A kesterite material with a low content of copper sulfides is obtained (according to Raman) after the sulfidation, even when sulfidation is carried out at relatively low temperature, e.g. at about 380° C. However, preferred sulfidation temperatures lie in the range from 550° C. to 620° C.

In an embodiment, the sulfur comprising gas is one or more of the following: $H_2S$, elemental sulfur in gaseous state ($S_2$—$S_8$), COS, $CS_2$ and organic sulfur compounds. The organic sulfur compounds are e.g. $CH_3SH$ and/or $CH_3SSCH_3$. Although hydrogen sulfide and/or elemental sulfur will often be preferred, the potential use of several other sulfur compounds adds flexibility to the process.

In an embodiment, the sulfur comprising gas further comprises selenium. Selenium may thus be introduced as a dopant either during precipitation or during the post-treatment operation. Typically, the gaseous selenium is produced on-site, e.g. by heating of selenium in an inert atmosphere or in a hydrogen containing atmosphere.

In an embodiment, the method further comprises the following steps between steps d) and e):
grinding the precursor for the kesterite material,
dispersing the grinded precursor in a liquid, thereby obtaining a slurry,
depositing a thin layer of the slurry onto a substrate, and optionally, drying the thin layer.

Advantageously, the precursor is grinded and dispersed in a liquid in order to reduce the particle size and form a slurry that subsequently is used to produce a thin layer comprising the precursor on a substrate by standard deposition techniques like spin coating, doctor-blading, printing, spray coating etc. followed by a drying step, if needed. The grinding method can be bead milling or any other standard method used for wet grinding. The size of all the precursor particles in the slurry should be below the desired thickness of the thin film. The liquid can be any solvent like water, ethanol, N-methyl-2-pyrrolidone etc. and also include dispersion additives as well as other additives. Drying will typically be done under controlled conditions to avoid cracks in the dried coat. The step of drying the thin layer could e.g. be done with heat treatment in an oxidizing atmosphere, such as air or any other oxygen containing gas or ozone. Hereby, dispersion agent and binder is removed by oxidation. The precursor layer is subsequently treated in a gas atmosphere comprising sulfur to form a uniform thin film of kesterite of CZTS, CZTSe or CZTSSe type. The method is well-suited to be used to make uniform thin films of kesterite with few defects (e.g. cracks), such as in photovoltaic cells.

In an embodiment, the method further comprises the following steps after step e):
grinding the kesterite material,
dispersing the grinded kesterite material in a liquid, thereby obtaining a slurry,
depositing a thin layer of the slurry onto a substrate, optionally, drying the thin layer, and
optionally, heat treating the thin layer.

Advantageously, the kesterite material obtained by step e) is grinded and dispersed in a liquid in order to reduce the particle size and form a slurry that subsequently is used to form a thin layer comprising the material on a substrate by standard deposition techniques like spin coating, doctor-blading, printing, spray coating etc. followed by drying. The grinding method can be bead milling or any other standard method used for wet grinding. The size of all the particles in the slurry should be below the desired thickness of the thin film. The liquid can be any solvent like water, ethanol, N-methyl-2-pyrrolidone etc. and also include dispersion additives as well as other additives. Drying will typically be done under controlled conditions to avoid cracks in the dried coat. Heat treatment may be done in a sulfidizing gas to form a uniform thin film of kesterite of CZTS, CZTSe or CZTSSe type. The heat treatment of the thin lay may be a two-step heat treatment, whereof the first step is a heat treatment in an oxidizing atmosphere, such as air, in order to remove dispersion agent and binder by oxidation, and the second step is a sulfidation treatment in order to compensate for any sulfur loss occurring during the heat treatment in the oxidizing atmosphere.

The method is well-suited to be used to make uniform thin films of kesterite with few defects (e.g. cracks), such as in photovoltaic cells.

Another aspect of the present invention relates to a precursor material for a kesterite material of CZTS, CZTSe or CZTSSe type, where the precursor material is substantially sulfur free and wherein powder XRD shows that the precursor material comprises a $Zn[Sn(OH)_6]$ phase and/or a $Cu[Sn(OH)_6]$ phase and/or a mixed $\{Cu, Zn\}[Sn(OH)_6]$ phase. This intimate mixing of the metals allows for easy and swift sulfidation and plays an important role in obtaining a practically phase pure CZTS, CZTSe or CZTSSe material after sulfidation. Consequently, a CZTS, CZTSe or CZTSSe type kesterite material prepared from the precursor material has a high purity. Thus, on sulfidation of the precursor, an almost phase pure kesterite material is achieved, comprising a very low fraction of copper sulfides, according to Raman spectroscopy.

In an embodiment, the kesterite material has a crystal size of 10-200 nm and a lattice constant a=5.438±0.5 Å and c=10.839±1.0 Å.

EXAMPLES

Example 1a. Preparation of a CZTS Hydroxy Carbonate Precursor

Two solutions were prepared: An acidic solution (solution A) and a basic solution (solution B).

Solution A was prepared by mixing 189.1 g of a copper nitrate solution which was analyzed to contain 16.8% wt/wt Cu (0.50 mol Cu) with 66 g of 65% $HNO_3$ (0.65 mol) and then adding 20.3 g of solid ZnO (0.25 mol) and diluting the resulting solution to 1.5 liter with deionized water.

Solution B was prepared by adding 74.7 g $K_2SnO_3*3H_2O$ (0.25 mol) to 241 g of a 33% wt/wt solution of $K_2CO_3$ (0.575 mol) and diluting the suspension to 1.5 liter with deionized water.

When almost all solids had dissolved (solution B does not become completely transparent), solution A and solution B were mixed in a large beaker which was mechanically stirred. The two solutions were simultaneously pumped into the beaker at constant and almost equal flow rates. pH was measured throughout this step and it was found to be fairly constant at approximately 6.5. After the two solutions had been mixed, the resultant blue precipitate was ripened by heating to 70° C. and keeping the temperature at 70° C. for one half hour. The product was filtered off, washed several times with hot, demineralized water and dried in an oven at 100° C. for 3 days.

XRD analysis (Rietveld refinement) of this material showed a $Zn[Sn(OH)_6]$ phase with average crystal size D=280 Å and lattice constant a=7.78 Å together with an amorphous phase. No copper-containing phase was detected.

Example 1b. Preparation of CZTS Material

The dried precursor obtained in Example 1a was sulfided in the following way. A sieved fraction of the precursor (0.15-0.30 mm) was used. A total of 0.5 g was loaded into a tubular reactor and heated to 380° C. in a stream of $N_2$ containing 100 ppm $H_2S$. The sulfur uptake was determined by gas chromatograph measurements. When the sample did not take up any more sulfur, the treatment was disrupted and the sample was cooled to ambient temperature.

The resultant black material was analyzed by XRD and Raman spectroscopy. XRD analysis (Rietveld refinement) showed phase pure $Cu_2ZnSnS_4$ with average crystal size D=446 Å and lattice constants a=5.438 Å and c=10.839 Å. Raman spectroscopy showed a single Raman shift at 327 $cm^{-1}$.

Example 2. Preparation of CZTS Film Based on Sulfur Free CZTS Precursor

A CZTS precursor was prepared as described in Example 1a with the exception that Cu:Zn:Sn ratio is 1.76:1.20:1.00. This precursor was heat treated in stagnant air at 350° C. for 4 h in order to transform the precursor into a Cu—Zn—Sn oxide precursor. A slurry for coating the Cu—Zn—Sn oxide precursor was prepared in the following way. 5 g ethanol (EtOH), 2 g of a VOC-free structured acrylic copolymer dispersion agent and 1 g of a polyvinylbutyral-based binder was added to a 50 ml PE bottle together with 30 g of $ZrO_2$ pearls, ø 1.5 mm and shaken in a paint shaker for 2 min. 10 g of the Cu—Zn—Sn oxide precursor was added and the slurry was further shaken for 600 min in the paint shaker. Diffuse reflectance spectroscopy was used to determine that 90% of the volume weighted particle size distribution was below 1 μm after this. Some of the slurry was applied as a thin layer onto a piece of soda-lime glass and dried in ambient air. By scanning electron spectroscopy, it was verified that the coated layer was approximately 1-2 μm thick, homogeneous and essentially free of large cracks. The coated soda-lime glass was then treated in a stream of nitrogen containing 10 vol % $H_2S$ at a temperature of 600° C., in order to transform the precursor film into a CZTS film. The optical quality of the film was checked by photoluminescence. The photoluminescence from the film had maximum intensity at a photon energy of 1.37 eV and the peak had a FWHM of 0.26 eV which indicates that a good quality CZTS with relative few defects that would be detrimental to the performance of a solar cell based on the material.

Example 3. Preparation of CZTS Film Based on CZTS Powder

A CZTS powder was prepared as described in Example 1b with the exception that it was sulfided in a stream of nitrogen containing 10 vol % $H_2S$ at 620° C. for 2 h. A slurry for coating this CZTS powder was prepared in the following way. 1.5 g EtOH, 0.6 g a VOC-free structured acrylic copolymer dispersion agent and 0.3 g of a polyvinylbutyral-based binder was added to a 10 ml PE bottle together with 9 g of $ZrO_2$ pearls, ø 1.5 mm and shaken in a paint shaker for 2 min. 3 g of CZTS powder was added and the slurry was further shaken for 180 min in the paint shaker. Diffuse reflectance spectroscopy was used to determine that 90% of the volume weighted particle size distribution was below 1 μm after this. Some of the slurry was applied as a thin layer onto a piece of soda-lime glass and dried in ambient air. By scanning electron spectroscopy, it was verified that the coated layer was approximately 1-2 μm thick, homogeneous and essentially free of large cracks. The optical quality of the film was checked by photoluminescence. The photo luminescence from the film had maximum intensity at a photon energy of 1.37 eV and the peak had a FWHM of 0.28 eV which indicates that a good quality CZTS with relative few defects that would be detrimental to the performance of a solar cell based on the material.

While the invention has been illustrated by a description of various embodiments and while these embodiments have been described in detail, it is not the intention of the applicant to restrict or in any way limit the scope of the appended claims to such detail. Additional advantages and modifications will readily appear to those skilled in the art. The invention in its broader aspects is therefore not limited to the specific details, representative methods, and illustrative examples shown and described. Accordingly, departures may be made from such details without departing from the spirit or scope of applicant's general inventive concept.

The invention claimed is:

1. A method of producing a kesterite material of CZTS, CZTSe or CZTSSe type, comprising the steps of:
   a) preparing an acidic solution and dissolving copper salt and zinc salt in water in desired molar ratio,
   b) preparing a basic solution by dissolving an alkali metal stannate together with an alkali metal carbonate or an alkali metal hydrogen carbonate or an alkali metal hydroxide or a combination thereof, and optionally with an alkali metal selenate or an alkali metal selenite or a mixture thereof,
   c) carrying out a precipitation reaction by mixing said acidic and said basic solution, thereby obtaining a precipitate,
   d) washing and heat treating said precipitate thereby providing a precursor for the kesterite material, and
   e) sulfurizing the precursor of step d to provide the kesterite material.

2. The method according to claim 1, wherein the salts used for the acidic solution are nitrates, halides, sulfates, carboxylates or combinations thereof.

3. The method according to claim 1, wherein the copper salt is copper (II) nitrate and the zinc salt is zinc (II) nitrate.

4. The method according to claim 1, wherein said acidic solution further comprises nitric acid.

5. The method according to claim 1, wherein said alkali metal stannate comprises $Na_2SnO_3$ and/or $K_2SnO_3$ in hydrated or anhydrous form.

6. The method according to claim 1, wherein said basic solution further comprises selenium in the form of an alkali metal selenate and/or an alkali metal selenite.

7. The method according to claim 1, wherein the step of sulfurizing comprises subjecting the precursor to a sulfur comprising gas at a temperature above room temperature.

8. The method according to claim 7, wherein said sulfur comprising gas is one or more of the following: $H_2S$, elemental sulfur in gaseous state ($S_2$-$S_8$), COS, $CS_2$, organic sulfur compounds.

9. The method according to claim 8, wherein said organic sulfur compounds are $CH_3SH$ and/or $CH_3SSCH_3$.

10. The method according to claim 1, wherein said sulfur comprising gas further comprises selenium.

11. The method according to claim 1, further comprising the following steps between steps d) and e):
    grinding the precursor for the kesterite material obtained by step d),
    dispersing said grinded precursor in a liquid, thereby obtaining a slurry,
    depositing a thin layer of the slurry onto a substrate, and optionally, drying said thin layer.

12. The method according to claim 11, wherein the step of dispersing said grinded precursor in a liquid comprises wetting and dispersing said grinded precursor in a liquid using polymeric wetting and/or dispersion agents.

13. The method according to claim 1, further comprising the following steps subsequent to step e):
grinding said kesterite material,
dispersing said grinded kesterite material in a liquid, thereby obtaining a slurry,
depositing a thin layer of the slurry onto a substrate,
optionally, drying said thin layer, and
optionally, heat treating such thin layer.

14. The method according to claim 13, wherein the step of dispersing said grinded kesterite material in a liquid comprises wetting and dispersing said grinded kesterite material in a liquid using polymeric wetting and/or dispersion agents.

15. A precursor material for a kesterite material of CZTS, CZTSe or CZTSSe type, where said precursor material is obtained by a process comprising the steps of:
a) preparing an acidic solution and dissolving copper salt and zinc salt in water in a desired molar ratio,
b) preparing a basic solution by dissolving an alkali metal stannate together with an alkali metal carbonate or an alkali metal hydrogen carbonate or an alkali metal hydroxide or a combination thereof,
c) carrying out a precipitation reaction by mixing the acidic and the basic solutions, thereby obtaining a precipitate, and
d) washing and heat treating the precipitate thereby providing a precursor for the kesterite material.

* * * * *